United States Patent [19]

Antoniadis et al.

[11] Patent Number: 5,719,467
[45] Date of Patent: Feb. 17, 1998

[54] ORGANIC ELECTROLUMINESCENT DEVICE

[75] Inventors: Homer Antoniadis, Mountain View; Daniel B. Roitman, Menlo Park; Jeffrey N. Miller, Los Altos Hills, all of Calif.

[73] Assignee: Hewlett-Packard Company, Palo Alto, Calif.

[21] Appl. No.: 508,020

[22] Filed: Jul. 27, 1995

[51] Int. Cl.$^6$ .................................................. H05B 33/26
[52] U.S. Cl. ......................... 313/506; 313/502; 313/503; 428/690
[58] Field of Search ............................... 313/506, 502, 313/501, 503, 504; 428/917, 690; 315/169.3

[56] References Cited

U.S. PATENT DOCUMENTS

| | | | |
|---|---|---|---|
| 4,356,429 | 10/1982 | Tang | 313/504 |
| 4,539,507 | 9/1985 | VanSlyke et al. | 313/504 |
| 4,885,211 | 12/1989 | Tang et al. | 428/457 |
| 5,047,687 | 9/1991 | VanSlyke et al. | 313/503 |
| 5,059,862 | 10/1991 | VanSlyke et al. | 313/503 |
| 5,142,343 | 8/1992 | Hosokawa et al. | 357/17 |
| 5,306,572 | 4/1994 | Ohashi et al. | 428/690 |
| 5,317,169 | 5/1994 | Nakano et al. | 257/40 |
| 5,374,489 | 12/1994 | Imai et al. | 428/690 |
| 5,500,568 | 3/1996 | Nakamura et al. | 313/503 |
| 5,529,853 | 6/1996 | Hamada et al. | 313/503 X |
| 5,540,999 | 7/1996 | Yamamoto et al. | 313/503 X |

FOREIGN PATENT DOCUMENTS

0643188A1  3/1995  European Pat. Off. .

OTHER PUBLICATIONS

C. W. Tang et al., "Electroluminescence of Doped Organic Thin Films", J. Appl. Phys. vol. 65, No. 9, May 1, 1989, pp. 3610–3616.
P. Yam, "Plastics Get Wired", Scientific American, Jul. 1995, pp. 83–87.
Y. Yang et al., "Enhanced Performance of Polymer Light-Emitting Diodes Using High-Surface Area Polyaniline Network Electrodes", J. Appl. Phys., vol. 77, No. 2, Jan. 15, 1995, pp. 694–698.
Y. Cao, "Solution-Cast of Polyaniline: Optical-Quality Transparent Electrodes", Appl. Phys. Lett., vol. 60, No. 22, Jun. 1, 1992, pp. 2711–2713.
Y. Yang et al., "Polyaniline as a Transparent Electrode for Polymer Light-Emitting Diodes: Lower Operating Voltage and Higher Efficiency", Appl. Phys. Lett., vol. 64, No. 10, Mar. 7, 1994, pp. 1245–1247.
C. Adachi et al., "Molecular Design of Hole Transparent Materials for Obtaining High Durability in Organic Electoluminescent Diodes", Appl. Phys. Lett., vol. 66, No. 20, May 15, 1995, pp. 2679–2681.
Y. Cao et al., "Counter-Ion Induced Processibilty of Conducting Polyaniline and of Conducting Polyblends of Polyaniline in Bulk Polymers", Synthetic Metals, vol. 48, 1992, pp. 91–97.

*Primary Examiner*—Ashok Patel
*Attorney, Agent, or Firm*—Herbert R. Schulze

[57] ABSTRACT

An organic electroluminescent device with a conducting polymer layer beneath the hole transport layer. A conducting polymer layer of doped polyaniline (PANI) is spin-cast onto an indium-tin oxide (ITO) anode coating on a glass substrate. Then a hole transport layer, for example TPD or another aromatic tertiary amine, is vapor-deposited onto the conducting polymer layer, followed by an electron transport layer and a cathode. Polyester may be blended into the PANI before spin-casting and then removed by a selective solvent after the spincasting, leaving a microporous layer of PANI on the anode. The conducting polymer layer may instead be made of a π-conjugated oxidized polymer or of TPD dispersed in a polymer binder that is doped with an electron-withdrawing compound. An additional layer of copper-phthalocyanine, or of TPD in a polymer binder, may be disposed between the conducting polymer layer and the hole transport layer. The conducting polymer layer may serve as the anode, in which case the ITO is omitted.

27 Claims, 5 Drawing Sheets

ORGANIC ELECTROLUMINESCENT DEVICE

BACKGROUND OF THE INVENTION

The present invention relates generally to electroluminescent devices and more particularly to an organic electroluminescent device having improved anodic structures adjoining organic active layers.

There has been an increasing need for versatile visual displays for electronic products of many kinds. Light-emitting diodes ("LEDs") and liquidcrystal displays ("LCDs") have found many useful applications but have not been adequate in all cases. A visual display that is of relatively recent origin and that has shown much promise is the organic electroluminescent device. An electroluminescent device basically consists of an electroluminescent substance placed between a pair of electrodes. When an electric potential is applied across the electrodes, the electroluminescent substance emits visible light. Typically one of the electrodes is transparent, permitting the light to shine through.

Figure 1:
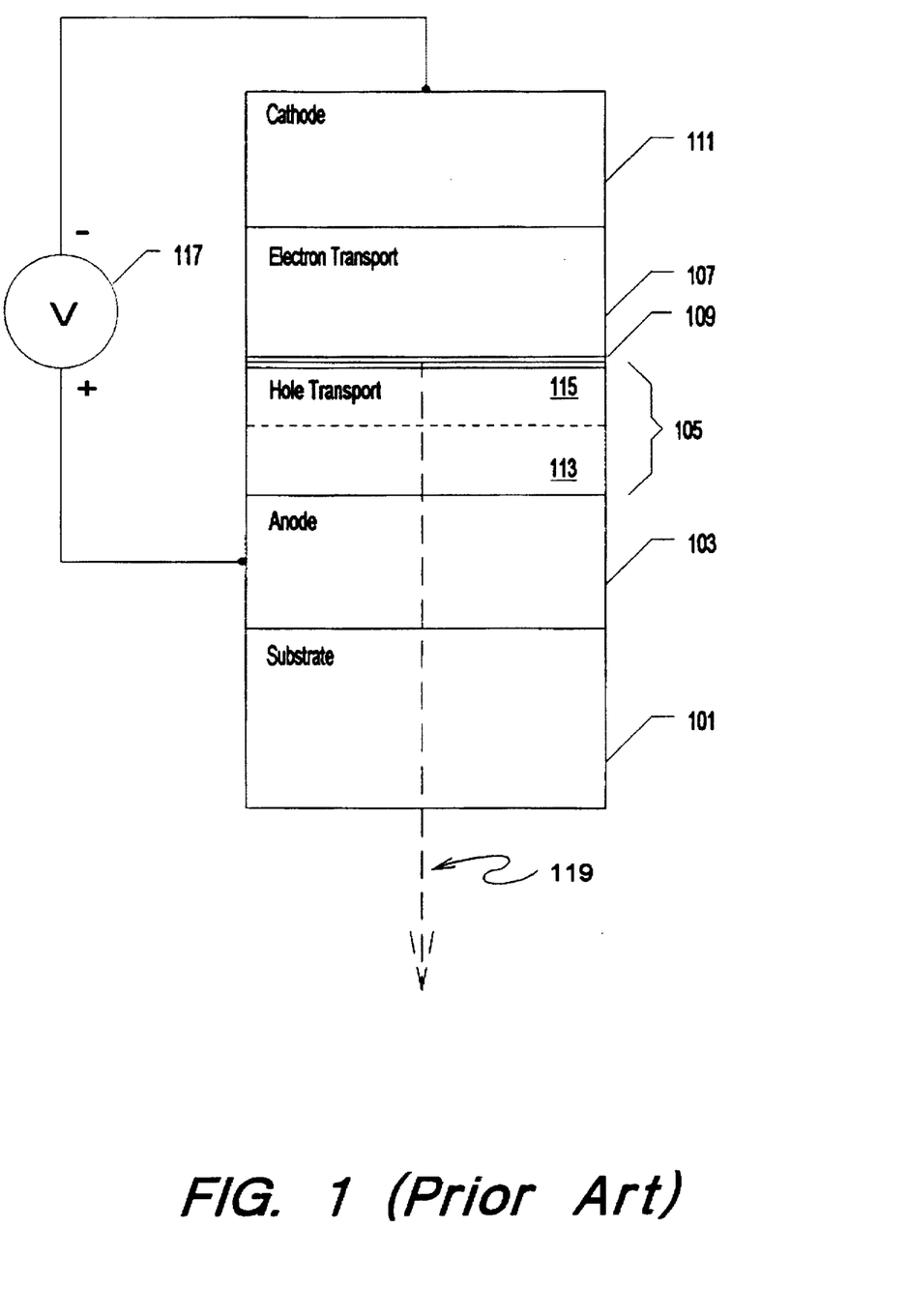
FIG. 1 is a sectional view of an organic electroluminescent device as known in the art.

FIG. 1 illustrates a typical electroluminescent device of the kind known in the art. A glass substrate 101, measuring perhaps 15 millimeters square, is coated with a transparent anode 103. A transparent hole transport layer 105 measuring about 10 millimeters square covers the anode and an electron transport layer 107 covers the hole transport layer, forming an interface 109 between the two layers. A cathode 111 covers the electron transport layer. In some devices the hole transport layer consists of two sublayers having slightly different composition, one sublayer forming a lower region 113 adjacent the anode and the other sublayer forming an upper region 115 adjacent the electron transport layer. The thicknesses of the anode, hole transport layer, electron transport layer and cathode are each of the order of 10–500 nanometers (100–5000 Ångstroms).

In operation, electric power from a voltage source 117 is applied to the anode and the cathode, biasing the anode positive with respect to the cathode. This causes regions of positive charge ("holes") to migrate through the hole transport layer from the anode toward the electron transport layer and electrons to migrate from the cathode through the electron transport layer toward the hole transport layer. The holes and electrons combine at the interface 109 between the two layers, emitting visible light. The light propagates out of the device through the hole transport layer, the anode and the substrate as indicated by an arrow 119.

It has been found that certain organic materials are particularly well suited for fabricating the hole and electron transport layers. An electroluminescent device fabricated of such materials is called an organic electroluminescent device. The anode of a typical organic electroluminescent device is made of indium tin oxide ("ITO"). Then the hole transport layer is formed by vapor deposition of N,N'-diphenyl-N-N'-bis(3-methylphenyl)-1,1'-biphenyl-4,4'-diamine ("TPD"). Next, the electron transport layer is formed, also by vapor deposition, of aluminum trihydroxyquinoline ($Alq_3$). Finally the cathode is formed by thermal evaporation of magnesium (Mg) and silver (Ag). Many different compounds and variations in structure have been used for the different layers and regions in organic electroluminescent devices. Examples of such devices and the specific compounds of which they are made are found in such references as U.S. Pat. No. 4,356,429 (Tang) issued Oct. 26, 1982; U.S. Pat. No. 4,539,507 (VanSlyke et al.) issued Sep. 3, 1985; U.S. Pat. No. 4,885,211 (Tang et al.) issued Dec. 5, 1989; U.S. Pat. No. 5,047,687 (VanSlyke) issued Sep. 10, 1991; and U.S. Pat. No. 5,059,862 (VanSlyke et al.) issued Oct. 22, 1991, all of which are incorporated herein by this reference. See also Tang et al., "Electroluminescence of Doped Organic Thin Films", *Journal of Applied Physics* no. 65(9), May 1, 1989, pages 3610–3616.

Use of a conducting polymer as the anode in a flexible LED based on poly(2-methoxy-5-(2'-ethyl-hexyloxy)-1,4-phenylene vinylene)("MEH-PPV") has been reported. This type of LED is fabricated by spin-casting MEH-PPV onto the anode to form the electroluminescent layers. The use in such a LED of a conducting film of polyaniline ("PANI"), either in place of or in addition to an ITO anode, is disclosed by Yang et al., "Enhanced Performance of Polymer Light-Emitting Diodes Using High-Surface Area Polyaniline Network Electrodes", *Journal of Applied Physics*, Jan. 15, 1995, pages 694–698; Cao et al., "Solution-Cast Films of Polyaniline: Optical-Quality Transparent Electrodes", *Applied Physics Letters* 60(22), Jun. 1, 1992, pages 2711–2713; and Yang et al., "Polyaniline as a Transparent Electrode for Polymer Light-Emitting Diodes: Lower Operating Voltage and Higher Efficiency", *Applied Physics Letters* 64(10), Mar. 7, 1994, pages 1245–1247. The reported advantages to using PANI in such LEDs include mechanical strength, reduced drive voltage, increased efficiency and adaptability to a flexible substrate.

A recurring problem with organic electroluminescent devices is a very short lifetime when continuously driven. Typically such a device has a useful life of less than 30 hours before all luminance has disappeared. There have been many attempts to overcome this problem so as to provide an organic electroluminescent device with a better useful life. For example, it is proposed by Adachi et al. in "Molecular Design of Hole Transport Materials for Obtaining High Durability in Organic Electroluminescent Diodes", *Applied Physics Letters* no. 66(20), May 15, 1995, pages 2679–2681, to use certain aromatic amines for the hole transport layer. Many aromatic tertiary amines that have been used to fabricate hole transport layers are disclosed in such references as U.S. Pat. No. 4,885,211(Tang et al.) at column 14 and U.S. Pat. No. 5,059,862 (VanSlyke et al.) at column 9. Adachi et al. report useful lifetimes ranging from a few hours for devices having hole transport layers made of some such amines to as much as 500 hours for others. Adachi et al. suggest that devices having hole transport layers fabricated of those amines which provided the smallest energy barrier between the anode and the hole transport layer had the longest lifetimes.

Another proposal for increasing the lifetimes of organic electroluminescent devices by using amines for the hole transport layer is set forth in U.S. Pat. No. 5,374,489 (Imai et al.) issued Dec. 20, 1994. Imai et al. propose using 4,4',4"-tri(N-phenothiazinyl)triphenylamine ("TPTTA" for short) or 4,4',4"-tri(N-phenoxazinyl)triphenylamine ("TPOTA") for the hole transport layer. Using TPTTA for the hole transport layer (Example 1) resulted in a half-life of 385 hours, and using TPOTA (Example 2) yielded a half-life of 370 hours. By comparison, using TPD for the hole transport layer resulted in a half-life of only 131 hours. Better results were achieved by using two different amines, one for each of the two regions of the hole transport layer. In Example 3, TPTTA was used for the upper region of the hole transport layer adjacent the luminescent layer and a second amine characterized by a "star burst" molecule, that is a molecule having a stellar structure such as 4,4',4"-tris (N-e-methylphenyl)-N-phenylamino)triphenylamine ("MTDATA") was used for the lower region adjacent the anode. A half-life of 550 hours resulted. Example 4 was similar except that TPOTA was used for the upper region, resulting in a half-life of 530 hours.

In U.S. Pat. No. 5,306,572 (Ohashi et al.) issued Apr. 26, 1994, attention was concentrated on the interfaces between the various layers of the organic electroluminescent device. In one embodiment it was proposed to create an "interfacial" layer between the anode and the hole transport layer by treating one of the layers with a silane-coupling agent to reduce unevenness of the anode layer and improve adherence between the layers. The silane-coupling agent is a compound represented by the formula X-Si(OR)$_3$ where R is a hydrolyzable group and X is a functional group capable of reacting with the organic substance such as an amino, vinyl, epoxy or mercapto group or a halogen. Devices fabricated using various silane-coupling agents were claimed to have useful lives of between 5,000 and 8,000 hours, as compared to 10 hours for a device that omitted the silane-coupling agent. Lifetimes of up to 15,000 hours were claimed by forming a hydrogenated microcrystalline silicon film on the anode prior to using the silane-coupling agent. The repeatability of this work is uncertain, and the cost of implementing the technique in production may be higher than desired.

From the foregoing it will be seen that there remains a need for an economical, reliable, durable, commercially practical organic electroluminescent device.

SUMMARY OF THE INVENTION

The present invention provides an organic electroluminescent device that uses a conducting form of a PANI film in its anodic structure to achieve greatly improved lifetimes. This device is economical to manufacture and efficient in operation.

Briefly and in general terms, an organic electroluminescent device according to the invention includes a thin film of a conducting polymer such as polyaniline doped with camphor-sulfonic acid between the anode and the hole transport layer. In an alternate embodiment the conducting polymer itself serves as the anode.

A method of fabricating an organic electroluminescent device according to the invention includes the steps of forming an anode on a substrate, spin-casting a conducting polymer layer onto the anode, vapor-depositing a hole transport layer onto the polymer layer, vapor-depositing an electron transport layer onto the hole transport layer, and finally forming a cathode on the electron transport layer. In an alternate embodiment the step of forming the anode is omitted, the conducting polymer layer being spin-cast directly onto the substrate.

Another embodiment of the method of the invention includes the additional steps of (1) mixing the conducting polymer with a material such as polyester prior to spin-casting and (2) removing the polyester after spin-casting with a selective solvent (a substance that is a solvent for polyester but not for the conducting polymer), leaving a microporous layer of conducting polymer on the anode.

Other aspects and advantages of the invention will become apparent from the following detailed description, taken in conjunction with the accompanying drawings, illustrating by way of example the principles of the invention.

DESCRIPTION OF THE PREFERRED EMBODIMENT

The present invention provides an organic electroluminescent device that has a thin conducting polymer layer between the anode and the hole transport layer. Other structural arrangements result in organic electroluminescent devices having lifetimes of only a few hours or other drawbacks. An organic electroluminescent device according to the invention is simple and economical to make and has a useful lifetime of the order of 1000 hours or more.

Figure 2:
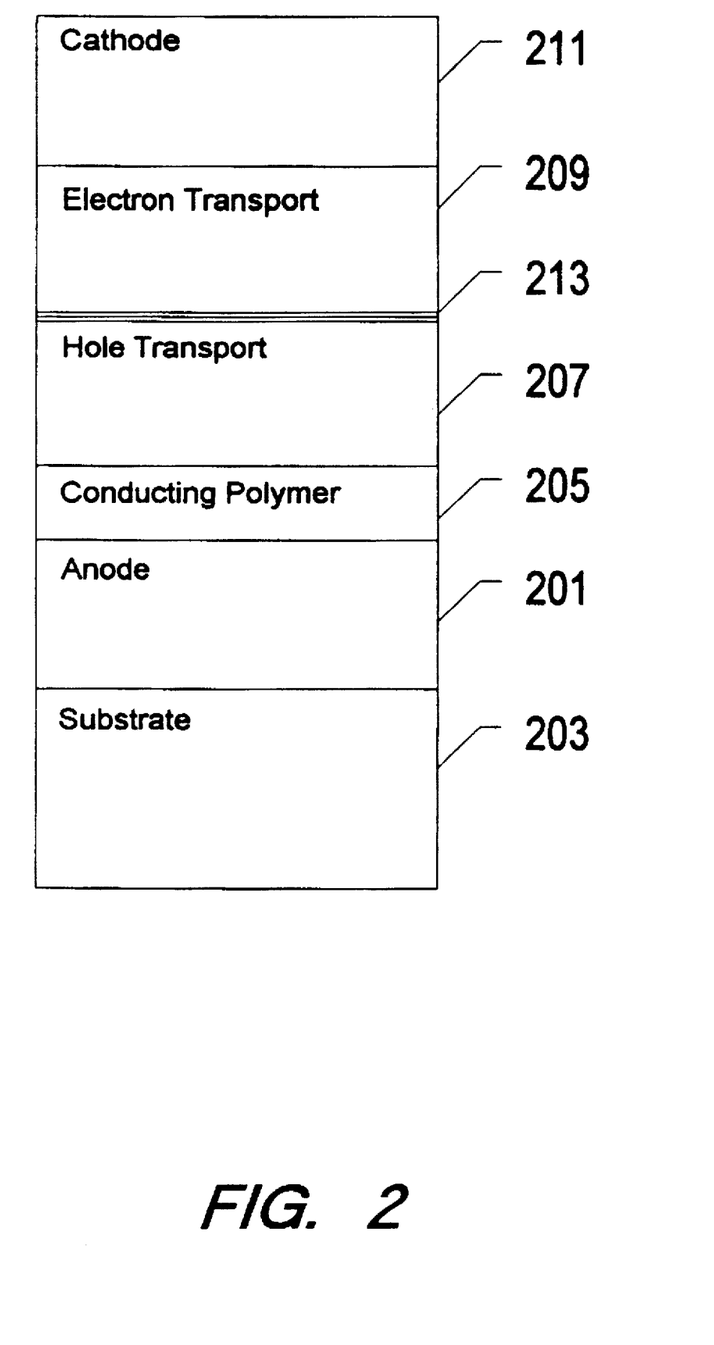
FIG. 2 is a sectional view of an organic electroluminescent device embodying the principles of the invention.

Referring now to FIG. 2, an organic electroluminescent device according to the invention includes an anode 201 on a substrate 203, a conducting polymer layer 205 adjacent the anode, a hole transport layer 207 adjacent the conducting polymer layer, an electron transport layer 209 adjacent the hole transport layer, and a cathode 211 adjacent the electron transport layer. When electric power is applied, biasing the anode positive with respect to the cathode, light is emitted at an interface 213 between the hole and electron transport layers.

In a preferred embodiment the conducting polymer layer comprises polyaniline ("PANI") doped with camphor-sulfonic acid. This compound is supplied by UNIAX Corporation, Santa Barbara, Calif. Its fabrication is described by Cao et al., "Counter-Ion Induced Processibility of Conducting Polyaniline and of Conducting Polyblends of Polyaniline in Bulk Polymers", Synthetic Metals No. 48 (1992), pages 91–97.

The PANI is spin-cast from a solution such as meta-cresol solution onto the anode, resulting in a smooth polymer film covering the anode. Or the PANI may first be mixed with a material such as polyester prior to the spin-casting, in which case the polyester is removed by rinsing with a selective solvent after the mixture has been spin-cast; this results in a microporous coveting of PANI.

The PANI may be doped in some other way than with camphor-sulfonic acid. For example, the PANI may be chemically oxidized by reaction with an oxidizing agent such as FeCl$_3$. Or an electrochemical charge transfer reaction may be used. Or the PANI may be protonated through acid-base chemistry by exposure to a protonic acid, for example in an aqueous environment having a pH of less than 2 to 3. Or the PANI may be oxidized through Lewis acid chemistry.

In another embodiment the conducting polymer layer comprises a π-conjugated oxidized polymer. The π-conjugated oxidized polymer preferably comprises poly(2-methoxy-5-(2'-ethyl-hexyloxy)-1,4-phenylene vinylene) ("MEH-PPV") doped with an electron-withdrawing compound. The electron-withdrawing compound is preferably selected from the group comprising FeCl$_3$, SbCl$_5$ and AsF5.

In still another embodiment, the conducting polymer layer comprises a hole-transporting compound such as N,N'- diphenyl-N-N'-bis(3-methylphenyl)-1,1'-biphenyl-4,4'-diamine ("TPD") dispersed in a polymer binder that has been doped with an electron-withdrawing compound. The electron-withdrawing compound is preferably selected from the group comprising $FeCl_3$, $SbCl_5$ and $AsF_5$. The polymer binder is preferably selected from the group comprising polycarbonates and polystyrenes.

Figure 3:
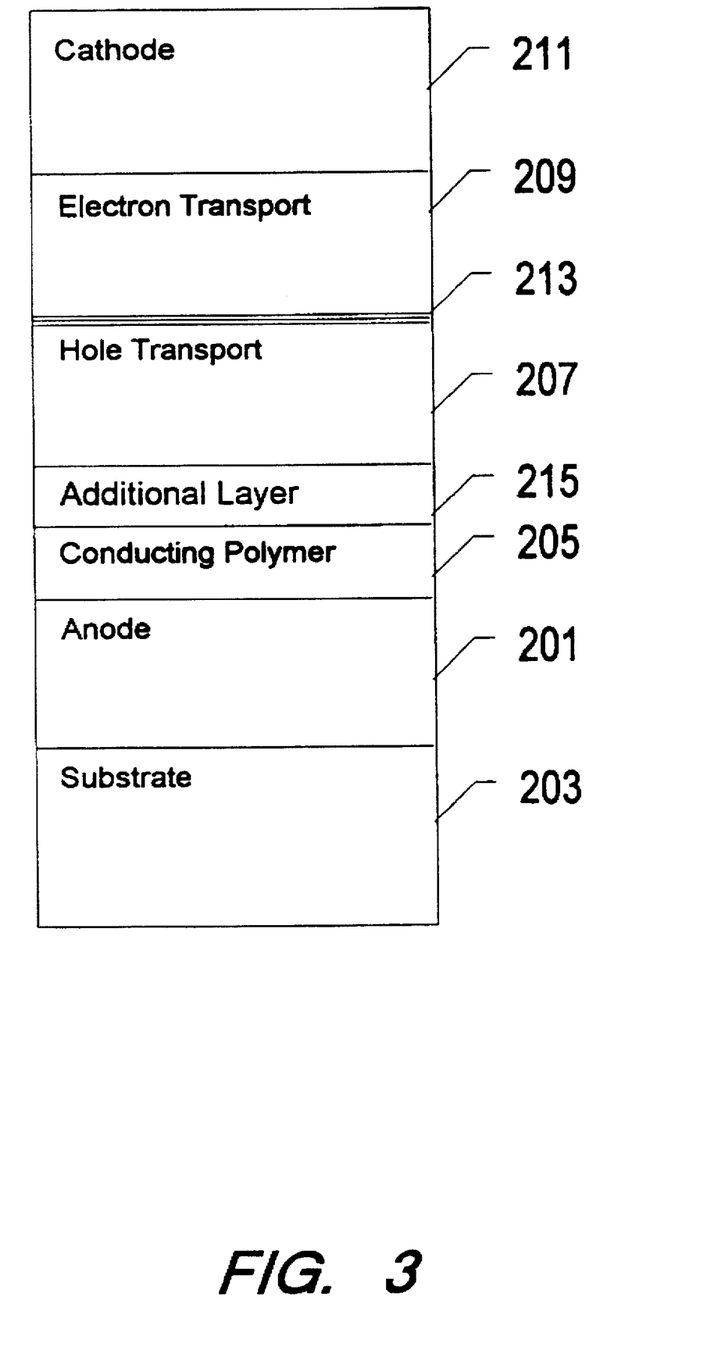
FIG. 3 is a sectional view of an alternate embodiment that is similar to the embodiment shown in FIG. 2 except for the addition of a layer between the conducting polymer layer and the hole transport layer.

FIG. 3 illustrates an embodiment that is similar in some respects to the embodiment illustrated in FIG. 2. For convenience, elements of FIG. 3 that are similar to elements of FIG. 2 will be assigned the same reference numerals and will not be further discussed. The embodiment illustrated in FIG. 3 includes an additional layer 215 of organic material between the conducting polymer layer 205 and the hole transport layer 207.

In one embodiment the additional layer 215 comprises a hole-transporting compound such as TPD dispersed in a polymer binder such as polystyrene. In another embodiment the additional layer 215 comprises copper-phthalocyanine.

Figure 4:
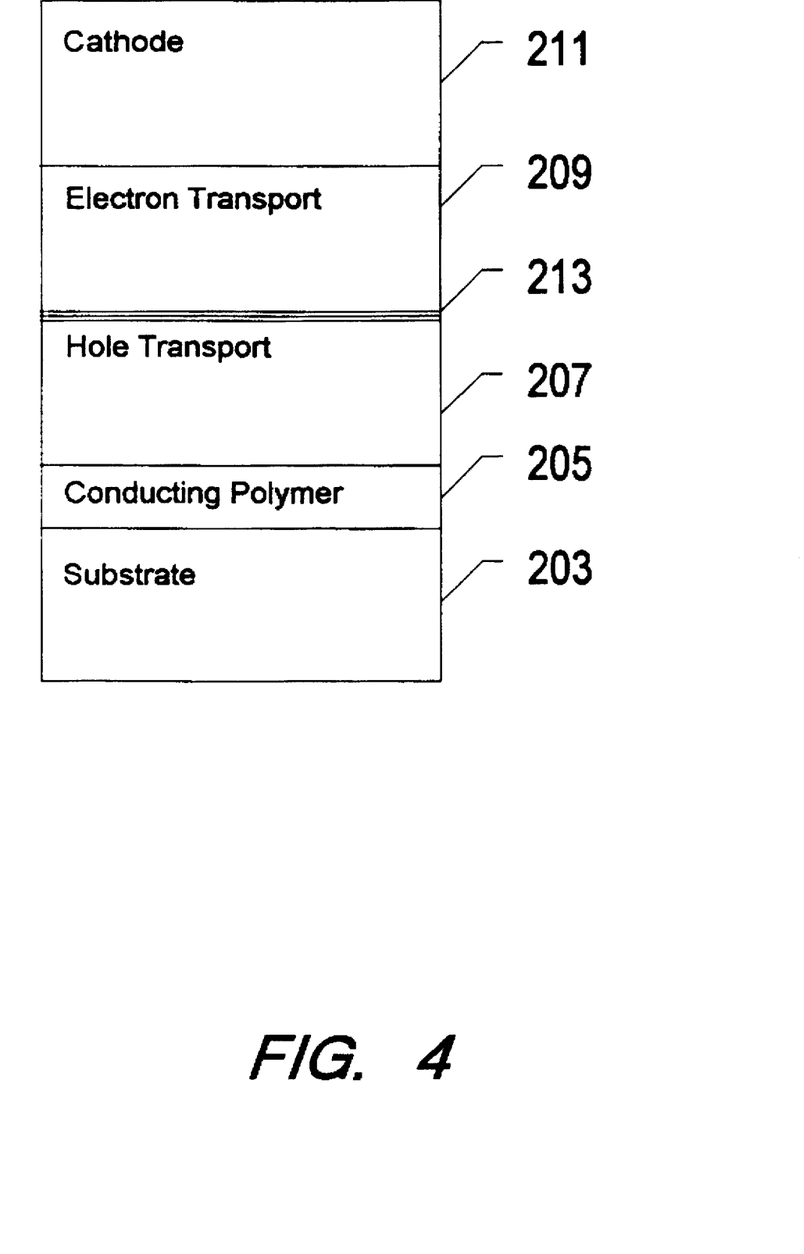
FIG. 4 is a sectional view of an alternate embodiment that is similar to the embodiment shown in FIG. 2 except for the omission of the anode layer.

FIG. 4 illustrates another embodiment that is similar in some respects to the embodiments illustrated in FIG. 2. For convenience, elements of FIG. 4 that are similar to elements of FIG. 2 will be assigned the same reference numerals and will not be further discussed. A comparison of these two figures will show that the embodiment illustrated in FIG. 4 differs from that illustrated in FIG. 2 in that the anode layer has been omitted from the embodiment shown in FIG. 4 In this embodiment, the conducting polymer layer 205 is formed directly on the substrate and serves as the anode.

A method of fabricating an organic electroluminescent device according to the principles of the invention includes the steps of spin-casting a conducting polymer layer onto a substrate; vapor-depositing a hole transport layer onto the conducting polymer layer; vapor-depositing an electron transport layer onto the hole transport layer; and thermally evaporating a conductive cathode layer onto the electron transport layer. If the device being fabricated is similar to any of the embodiments depicted in FIGS. 2 and 3, the substrate already will have been coated with a conducting anodic material such as ITO prior to spin-casting the conducting polymer layer.

If the device being fabricated includes the additional layer 215 and if that layer comprises a hole-transporting compound dispersed in a polymer binder, then the method of the invention also includes the step of spinning this material onto the conducting polymer layer prior to the step of vapor-depositing the hole transport layer. Similarly, if the additional layer comprises copper-phthalocyanine, the method of the invention includes the step of depositing that substance onto the conducting polymer layer prior to vapor-depositing the hole transport layer.

Another embodiment of the method includes the step of mixing the conducting polymer layer with a substance such as polyester prior to the spin-casting. After the mixture is spun on, a selective solvent (a substance that is a solvent for the polyester but not for the conducting polymer) may be used to remove the polyester, leaving a microporous layer of conducting polymer. Or, instead of using a solvent and ending up with a microporous layer, a substance such as TPD dispersed in polystyrene (TPD:PS) may be spun from a solution such as xylene onto the polymer/polyester film; the TPD:PS replaces the polyester in the film.

Figure 5:
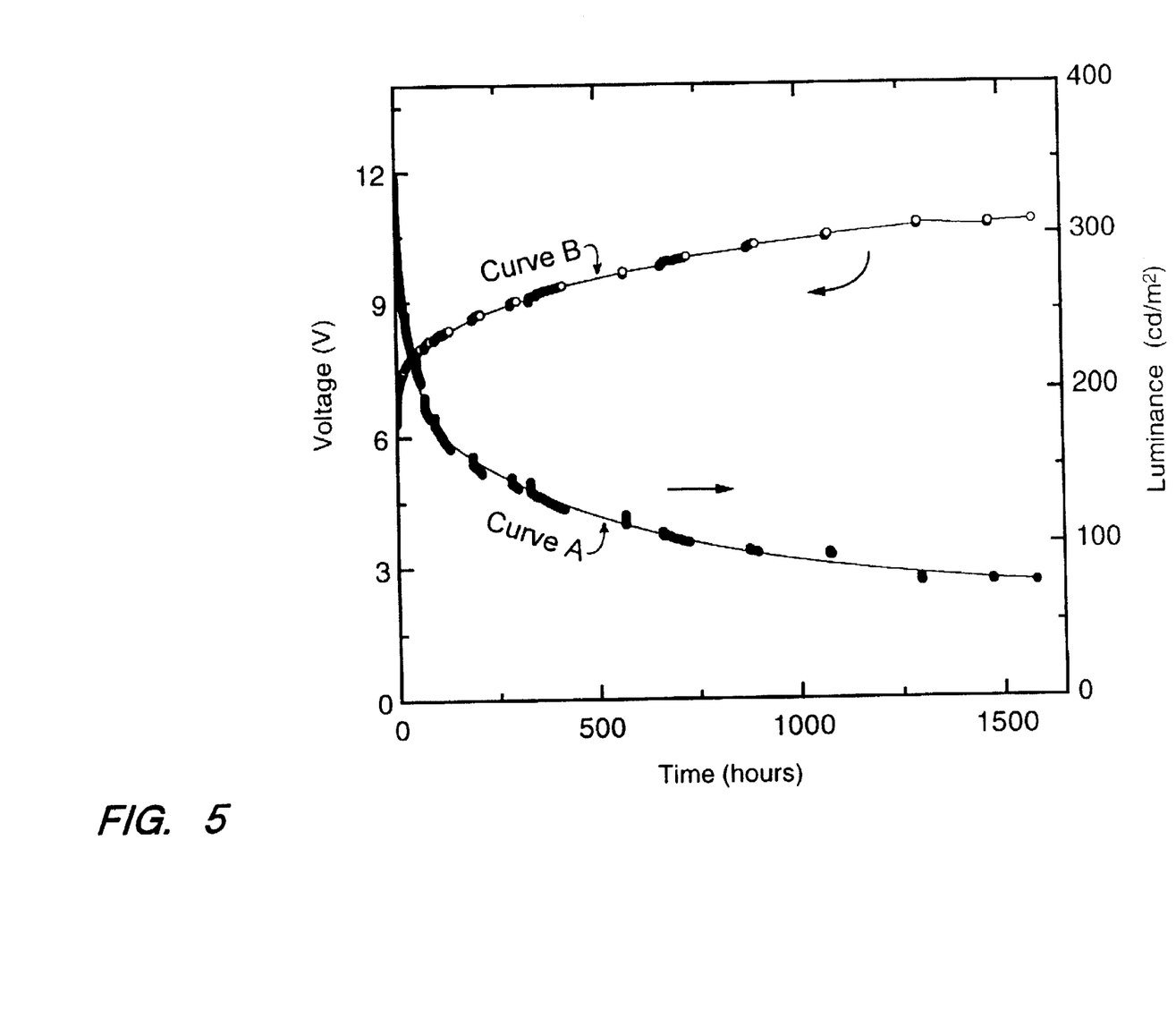
FIG. 5 is a graph showing the results obtained from an organic electroluminescent device embodying the principles of the invention.

FIG. 5 illustrates the performance of a typical organic electroluminescent device embodying the principles of the invention. The device of which FIG. 5 shows the performance is described in Example 13 below. Luminance as a function of time decreased rapidly from an initial peak of 340 $cd/m^2$ to about 150 $cd/m^2$ within the first 100 to 150 hours but then decreased only slightly during the next 1500 hours, as shown by curve A. Curve B shows that the anode-cathode voltage increased from an initial voltage of 6.4 to over 9 volts during the first hours of operation and then remained nearly constant during the next 1500 hours.

The following examples will further explain and illustrate the principles of the invention and its advantages.

EXAMPLE 1

Device According to the Prior Art (FIG. 1)

A transparent substrate of ITO-coated glass (obtainable from Donnelley Applied Films) having a sheet resistance of 85 $\Omega/\square$ and a thickness of 450 Å was washed with a water-based detergent, followed by acetone and isopropyl alcohol rinses. Then a TPD hole transport layer with a thickness of 600 Å was deposited on the anode by vacuum deposition at the rate of 5 Å/sec. The TPD was evaporated from a RADAK II vacuum evaporator with an alumina crucible heated by a tungsten filament. An electron transport layer of $Alq_3$, also with a thickness of 600 Å was then deposited on top of the TPD layer at the rate of 5 Å/sec. The $Alq_3$ was also evaporated from a RADAK II vacuum evaporator. Finally a cathode, consisting of 1000 Å of magnesium and 1000 Å of a silver protecting layer, was deposited on top of the $Alq_3$ layer. Both metals were evaporated from a Radak II vacuum evaporator at the rate of 10 Å/sec.

When the resultant organic electroluminescent device was operated in a nitrogen ($N^2$) rich dry box under constant direct current of 10 $mA/cm^2$, its initial output luminance was 300 $cd/m^2$ and the voltage across the anode and cathode was 7 volts. The device exhibited very poor reliability—in less than two hours of continuous operation a catastrophic failure occurred and the device stopped emitting light.

EXAMPLE 2

Device According to the Invention (FIG. 2)

Example 1 was repeated, except that a conducting polymer layer was spun on the ITO/glass substrate prior to the TPD vacuum deposition. The conducting polymer layer was 750 Å of polyaniline (PANI) doped with camphor-sulfuric acid (CSA) spun onto the ITO from a meta-cresol solution.

When the resultant organic electroluminescent device was operated under constant direct current of 10 $mA/cm^2$, its initial output luminance was 520 $cd/m^2$ at an anode-cathode voltage of 6.5 volts. This shows an improvement on the external efficiency of the electroluminescent device. It also shows that the PANI:CSA layer assists hole injection.

EXAMPLE 3

Device According to the Invention (FIGS. 2 and 5)

Example 2 was repeated. The device was operated under constant direct current of 10 $mA/cm^2$ for about 1500 hours in a $N_2$ rich dry box. The luminance attenuated from 340 $cd/m^2$ to 75 $cd/m^2$ and the voltage across the anode and cathode increased from 6.4 to 10.8 volts, all as shown in FIG. 5. No catastrophic failure or formation of black spots were observed. This result shows that the thin layer of PANI substantially increases the life of the organic electroluminescent device.

EXAMPLE 4

Various Thicknesses of the Conducting Polymer Layer (FIG. 2)

Example 2 was repeated for three more devices having PANI:CSA layer thicknesses of 950 Å, 1300 Å, and 2000 Å.

respectively. When the resultant devices were operated under constant direct current of 10 mA/cm$^2$ their initial output luminances were 300 cd/m$^2$, 260 cd/m$^2$, and 235 cd/m$^2$ respectively, all at an anode-cathode voltage of 6.5 volts. This shows an inverse relationship between the external efficiency of the device and the thickness of the PANI:CSA. It also shows that the thickness of the PANI:CSA layer does not affect the injection of holes, thereby verifying the conducting properties of PANI:CSA.

EXAMPLE 5

Polymer Layer of Doped TPD (FIG. 2)

Example 2 was repeated, except that a thin conducting polymer layer of TPD dispersed in polystyrene (PS) and doped with the electron withdrawing compound FeCl$_3$ was spun on the ITO/glass prior to TPD deposition. When the resultant device was operated under a constant direct current of 10 mA/cm$^2$ the initial output luminance was 400 cd/m$^2$ at an anode-cathode voltage of 6.5V. This shows an improvement of the external efficiency of the device. It also shows that the conducting layer of TPD:PS doped with an electron withdrawing compound assists hole injection. When the device was operated under a constant direct current of 40 mA/cm$^2$ for about 20 hours in a N$_2$ rich dry box, the luminance attenuated from an initial value of 1700 cd/m$^2$ to an elapsed output luminance of 300 cd/m$^2$ and the voltage across the anode and cathode increased from 8V to 16V

EXAMPLE 6

Polymer Blend (FIG. 2)

Example 2 was repeated, except that the conducting polymer layer consisted of a polymer blend of PANI:CSA and polyester (PE) that was spun on the ITO/glass from meta-cresol solution. The PE phase was washed out with xylene, thus a microporous PANI:CSA film was obtained. When the resultant device was operated under a constant direct current of 10 mA/cm$^2$, its initial output luminance was 330 cd/m$^2$ at an anode-cathode voltage of 7V. High driving stability was found, which shows that blends of PANI:CSA and PE can be used where PE may play a neutral role.

EXAMPLE 7

Additional Layer of TPD (FIG. 3)

Example 2 was repeated, except that the conducting polymer layer consisted of a polymer blend of PANI:CSA and polyester (PE) that was spun on the ITO/glass from meta-cresol solution, and then a thin layer of TPD dispersed in polystyrene CFPD:PS) was spun from xylene solution onto the PANI:CSA/PE blend prior to depositing the TPD layer. The TPD:PS mixture replaced the PE in the polymer blend. The observed behavior of this device was very similar to the behavior of the device described in Example 5.

EXAMPLE 8

Additional Layer of Copper-Phthalocyanine (FIG. 3)

Example 2 was repeated, except that a 230 Å layer of copper-phthalocyanine was deposited on the PANI:CSA layer prior to the vapor deposition of the TPD, and the TPD layer was only 300 Å thick. When the resultant device was operated under a constant direct current of 40 mA/cm$^2$ for about 500 hours in a N$_2$ rich dry box, the luminance attenuated from an initial value of 1200 cd/m$_2$ to 150 cd/m$^2$ and the anode-cathode voltage increased from 6.7V to 9.3V.

EXAMPLE 9

Conducting Polymer Layer as Anode (FIG. 4)

Example 2 was repeated except that the conducting polymer layer was spun directly on the glass surface prior to the TPD deposition. In this example the ITO transparent thin layer was omitted. When the resultant device was operated under constant direct current of 10 mA/cm$^2$, its initial output luminance was 300 cd/m$^2$ at an anode-cathode voltage of 6.9 volts. The device was found to have high driving stability, thereby demonstrating that PANI:CSA usefully serves as an anode layer in place of ITO.

From the foregoing it will be appreciated that an organic electroluminescent device according to the invention is easily and economically manufactured and provides a useful life well in excess of 1000 hours. Although specific embodiments of the invention have been described and illustrated, the invention is not to be limited to the specific forms or arrangements of parts so described and illustrated. The invention is limited only by the claims.

We claim:

1. An organic electroluminescent device comprising:
    an anode on the substrate,
    a first hole transport layer fabricated of an aromatic tertiary amine adjacent the anode,
    an electron transport layer adjacent the first hole transport layer,
    a cathode adjacent the electron transport layer, and
    a conductive polymer layer between the anode and the hole transport layer.

2. The organic electroluminescent device of claim 1 wherein the conductive polymer layer comprises doped polyaniline.

3. The organic electroluminescent device of claim 2 wherein the polyaniline comprises a microporous film.

4. The organic electroluminescent device of claim 2 and further comprising a second hole transport layer fabricated of an aromatic tertiary amine dispersed in a polymer binder between the conducting polymer layer and the first hole transport layer.

5. The organic electroluminescent device of claim 4 wherein the second hole transport layer comprises N,N'-diphenyl-N-N'-bis(3-methylphenyl)-1,1'-biphenyl-4,4'-diamine "TPD", and wherein the polymer binder comprises polystyrene.

6. The organic electroluminescent device of claim 2 wherein the doped polyaniline comprises polyaniline doped with camphor-sulfonic acid.

7. The organic electroluminescent device of claim 2 wherein the doped polyaniline comprises polyaniline that has been doped by being oxidized through Lewis acid chemistry.

8. The organic electroluminescent device of claim 2 wherein the doped polyaniline comprises polyaniline that has been doped by being protonated through an acid-base chemistry.

9. The organic electroluminescent device of claim 1 wherein the conductive polymer layer comprises π-conjugated oxidized polymer.

10. The organic electroluminescent device of claim 9 wherein the π-conjugated oxidized polymer comprises poly "MEH-PPV") doped with an electron-withdrawing compound.

11. The organic electroluminescent device of claim 10 wherein the electron-withdrawing compound is selected from the group comprising $FeCl_3$, $SbCl_5$ and $AsF_5$.

12. The organic electroluminescent device of claim 1 wherein the conductive polymer layer comprises:
   a polymer binder doped with an electron-withdrawing compound; and
   a hole-transporting compound dispersed in the polymer binder.

13. The organic electroluminescent device of claim 12 wherein the hole-transporting compound comprises an aromatic tertiary amine.

14. The organic electroluminescent device of claim 12 wherein the hole-transporting compound comprises N,N'-diphenyl-N-N'-bis(3-methylphenyl)-1,1'-biphenyl-4,4'-diamine "TPD").

15. The organic electroluminescent device of claim 12 wherein the polymer binder is selected from the group comprising polycarbonates and polystyrenes.

16. The organic electroluminescent device of claim 12 wherein the electron-withdrawing compound is selected from the group comprising $FeCl_3$, $SbCl_5$, and $AsF_5$.

17. The organic electroluminescent device of claim 1 and further comprising a second hole transport layer of copper-phthalocyanine between the conducting polymer layer and the first hole transport layer.

18. An organic electroluminescent device comprising: a glass substrate; a conductive polymer layer formed on the glass substrate to define an anode; an organic hole-transport layer fabricated of an aromatic tertiary amine on the anode; an organic electron-transport layer on the hole-transport layer; and a cathode on the electron-transport layer.

19. An organic electroluminescent device as in claim 18 wherein the conductive polymer layer comprises polyaniline doped with camphor-sulfonic acid.

20. An organic electroluminescent device as in claim 18 wherein the conductive polymer layer comprises a π-conjugated oxidized polymer.

21. An organic electroluminescent device as in claim 18 wherein the conductive polymer layer comprises: a polymer binder doped with an electron-withdrawing compound; and a hole-transporting compound dispersed in the polymer binder.

22. An organic electroluminescent device as in claim 1 wherein the aromatic tertiary amine comprises N,N'-diphenyl-N-N'-bis(3-methylphenyl)-1,1'-biphenyl-4,4'-diamine ("TPD").

23. An organic electroluminescent device as in claim 2 wherein the aromatic tertiary amine comprises N,N'-diphenyl-N-N'-bis(3-methylphenyl)-1,1'-biphenyl-4,4'-diamine "TPD").

24. An organic electroluminescent device as in claim 9 wherein the aromatic tertiary amine comprises N,N'-diphenyl-N-N'-bis(3-methylphenyl)-1,1'-biphenyl-4,4'-diamine "TPD").

25. An organic electroluminescent device as in claim 12 wherein the aromatic tertiary amine comprises N,N'-diphenyl-N-N'-bis(3-methylphenyl)-1,1'-biphenyl-4,4'-diamine "TPD").

26. An organic electroluminescent device as in claim 17 wherein the aromatic tertiary amine comprises N,N'-diphenyl-N-N'-bis(3-methylphenyl)-1,1'-biphenyl-4,4'-diamine "TPD").

27. An organic electroluminescent device as in claim 18 wherein the aromatic tertiary amine comprises N,N'-diphenyl-N-N'-bis(3-methylphenyl)-1,1'-biphenyl-4,4'-diamine "TPD").

* * * * *